US006618787B2

(12) United States Patent
Caselli et al.

(10) Patent No.: US 6,618,787 B2
(45) Date of Patent: Sep. 9, 2003

(54) COMPUTER PRINTED CIRCUIT SYSTEM BOARD WITH LVD SCSI DEVICE DIRECT CONNECTOR

(75) Inventors: Lisa Ann Caselli, Fort Collins, CO (US); Heather Lea Stickler, Fort Collins, CO (US); Jon-Christophe Bernard Febvre, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/737,189

(22) Filed: Dec. 14, 2000

(65) Prior Publication Data

US 2002/0075637 A1 Jun. 20, 2002

(51) Int. Cl.[7] .............................. G06F 13/00; H05K 7/02
(52) U.S. Cl. ........................................ 710/305; 361/777
(58) Field of Search ................................. 710/305, 100, 710/300; 361/760–783

(56) References Cited

U.S. PATENT DOCUMENTS

| | | | | |
|---|---|---|---|---|
| 4,837,622 A | * | 6/1989 | Whann et al. ............... 324/754 |
| 5,308,926 A | * | 5/1994 | Auerbuch et al. ........... 174/250 |
| 5,449,863 A | * | 9/1995 | Nakatani et al. ............ 174/250 |
| 5,523,921 A |   | 6/1996 | Van Lydegraf ............. 361/818 |
| 5,530,831 A | * | 6/1996 | Akiyama et al. ........... 711/114 |
| 5,745,795 A | * | 4/1998 | Pecone et al. ................ 710/62 |
| 5,764,489 A | * | 6/1998 | Leigh et al. ................. 361/777 |
| 5,768,109 A | * | 6/1998 | Gulick et al. ............... 361/794 |
| 5,903,442 A | * | 5/1999 | Kanai et al. ................ 361/788 |
| 5,955,704 A | * | 9/1999 | Jones et al. ................. 174/262 |
| 5,986,893 A | * | 11/1999 | Leigh et al. ................ 361/777 |
| 6,011,695 A | * | 1/2000 | Dumke ....................... 361/777 |
| 6,024,607 A |   | 2/2000 | Wahl .......................... 439/639 |
| 6,072,699 A | * | 6/2000 | Horine ........................ 361/777 |
| 6,134,093 A | * | 10/2000 | Masghati ................... 361/119 |
| 6,174,198 B1 | * | 1/2001 | Wu et al. ................. 439/541.5 |
| 6,215,372 B1 | * | 4/2001 | Novak .......................... 333/12 |
| 6,236,572 B1 | * | 5/2001 | Teshone et al. ............ 361/794 |
| 6,295,565 B1 | * | 9/2001 | Lee ............................. 710/301 |

* cited by examiner

Primary Examiner—Sumati Lefkowitz

(57) ABSTRACT

A PCSB assembly including a PCSB; a plurality LVD SCSI bus signal traces formed in the PCSB; and a LVD SCSI direct connector mounted on the PCSB and electrically connected to the plurality of traces.

17 Claims, 10 Drawing Sheets

COMPUTER PRINTED CIRCUIT SYSTEM BOARD WITH LVD SCSI DEVICE DIRECT CONNECTOR

RELATED APPLICATIONS

The present application is related to U.S. patent application Ser. No. 09/736,615 of Heather Lea Stickler and Lisa Ann Caselli for Printed Circuit Board Layout, which was filed on the same date as the present application and which is hereby incorporated by reference for all that it discloses.

FIELD OF THE INVENTION

The present invention relates generally to printed circuit system boards and, more specifically, to method and apparatus for connecting a LVD SCSI device to a printed circuit system board.

BACKGROUND OF THE INVENTION

A printed circuit system board (PCSB) is a printed circuit board used in a computer which contains the computer central processing unit (CPU) and is thus the primary circuit board of the computer. A printed circuit board is a device used for interconnecting separate circuitry, electrical components and devices used by a computer. A common standard used for computer input/output (I/O) communications is Low Voltage Differential (LVD) Small Computer Systems Interface (SCSI). (There are various types of SCSI buses other than LVD SCSI buses but it is to be understood that any reference to "SCSI" in this patent application, unless otherwise indicated, is a reference to LVD SCSI.) A typical LVD SCSI bus found on a PCSB includes a LVD SCSI controller device such as an ASIC which is mounted on one surface layer of the PCSB. The SCSI controller controls the LVD SCSI signals sent between the computer's CPU and SCSI devices, such as hard drives, DVD drives, etc., which are connected to the SCSI bus. In currently used PCSB's the LVD SCSI bus includes a number of signal traces or conductors which extend between the SCSI controller and a cable connector device mounted on the PCSB. The cable connector device is adapted to matingly receive a coupling member provided on one end of a computer cable. The other end of the computer cable is provided with another coupling member that is adapted to be attached to a cable connector mounted on a smaller, auxiliary, printed circuit board usually called a "back plane." The auxiliary circuit board includes a series of signal traces which extend from the cable connector to one or more SCSI device connectors mounted on the back plane. The LVD SCSI device connector on the back plane may be a direct connector such as SCA-2 connector to which a LVD SCSI device may be directly mounted. The back plane further includes LVD SCSI terminator devices to which end portions of the SCSI traces are connected after connection thereof to the last direct connector. The terminators are active circuit devices which prevent signal reflection, etc.

Back plane mounted SCSI direct connectors provide a physically and electrically secure method for operably connecting a SCSI device to a computer. The fact that the back plane is on a separate board from the PCSB adds flexibility to the computers design since the back plane is small and may be moved where ever the associated SCSI device is to be located. However back planes add cost to a computer system because they must be separately fabricated. Also, because they contain SCSI terminators, they are considered active PCB's which must be tested separately from the PCSB, adding to the overall cost. The cable between the PCSB and the cable connectors provided on the PCSB and the back plane also add to overall cost.

Another problem discovered by applicants with regard to the use of back plane mounted SCSI direct connectors is that such assemblies may frustrate certain SCSI bus noise management strategies discovered by applicants. Applicants have discovered that by isolating certain SCSI bus signals from other SCSI bus signals on the PCSB that a significant improvement in SCSI device performance may be achieved. However when these signals are conventionally routed through SCSI computer cabling to a back plane the improved performance is typically lost because the critical signal isolation is lost in the cabling.

SUMMARY OF THE INVENTION

The above discussed problems with SCSI device mounting and operation, which applicants were the first to fully appreciate, may be overcome by mounting SCSI direct connectors and associated terminators directly on the computer's PCSB rather than a separate back plane. Such an assembly obviates the need for SCSI connector cables as well as the back plane. Also, when such a PCSB assembly is used, applicants have discovered that SCSI bus performance may be considerably improved because of the elimination of certain noise associated with SCSI cable connections. Furthermore, when careful trace isolation of the RESET, SELECT and BUSY signals of the SCSI bus is maintained, even better bus performance may be achieved. This latter achievement is generally not achievable when cable connection is used because the circuit designer has no control over signal routing in the computer cables which are built to a preset industry standard.

Thus the invention may comprise a PCSB assembly including a PCSB; a plurality of LVD SCSI bus signal traces formed in the PCSB; and a LVD SCSI direct connector mounted on the PCSB and electrically connected to the plurality of traces.

The invention may also comprise a method of making a PCSB assembly including: forming a plurality of LVD SCSI bus signal traces on a PCSB; mounting a LVD SCSI direct connector on the PCSB; and electrically connecting the plurality of traces to the LVD SCSI direct connector.

The invention may also comprise a PCSB assembly including a PCSB; means for conducting LVD SCSI bus signals formed in the PCSB; and means for directly mounting a LVD SCSI device on the PCSB electrically connected with the means for conducting LVD SCSI bus signals.

The invention may also comprise a computer including a printed circuit board; a computer central processing unit operably mounted on the printed circuit board; a LVD SCSI bus controller mounted on the printed circuit board; a LVD SCSI direct connector mounted on the printed circuit board; a plurality of LVD SCSI signal traces electrically connected to the LVD SCSI bus controller and to the LVD SCSI direct connector; and a LVD SCSI device directly operably mounted in the LVD SCSI direct connector.

DETAILED DESCRIPTION

Figure 1:
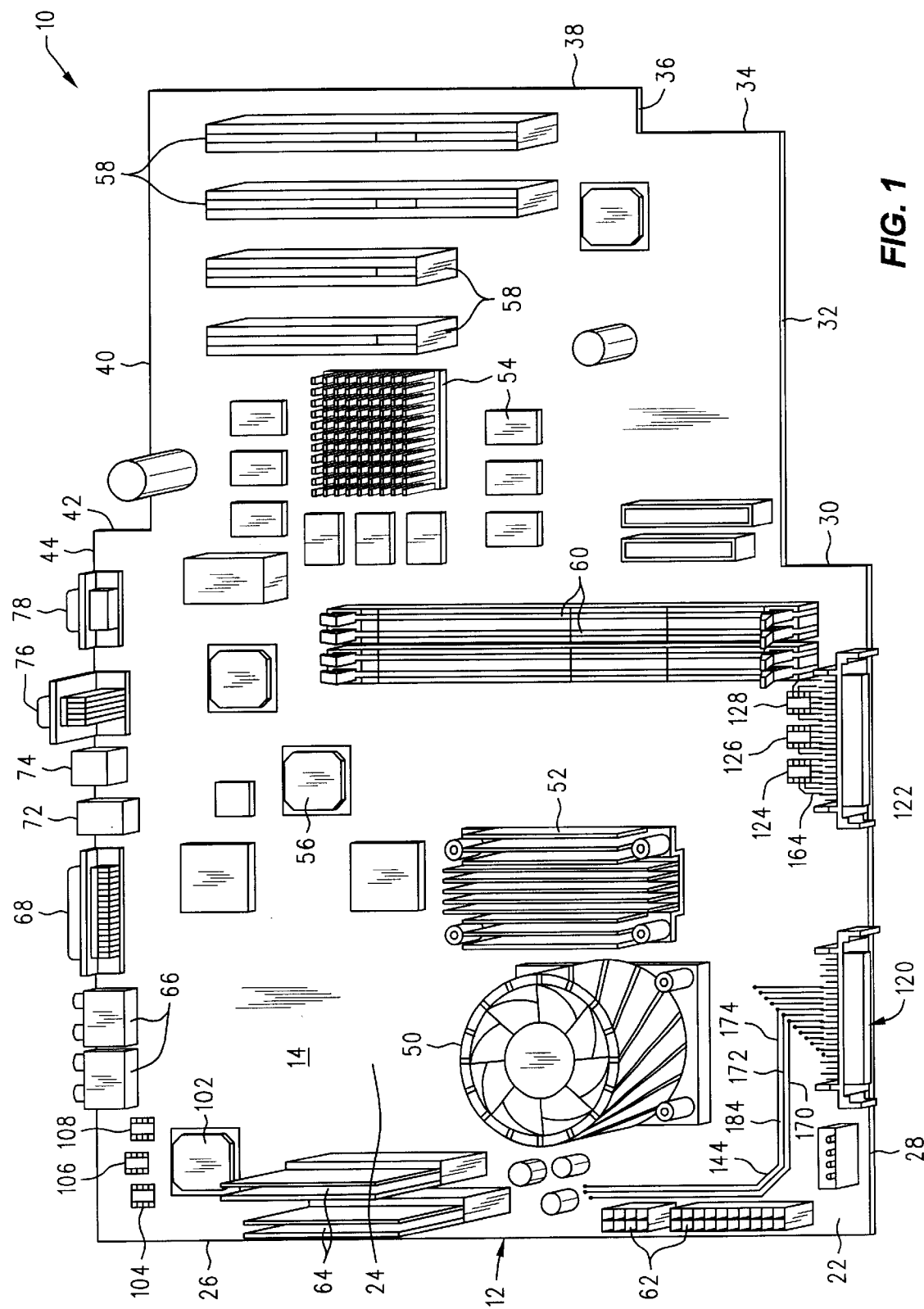
FIG. 1 is a top perspective view of a printed circuit system board assembly (PCSB)

The drawing FIGS. 1–11, in general, show a PCSB assembly including a PCSB 10; a plurality of LVD SCSI bus signal traces 140 formed in the PCSB 10; and a LVD SCSI direct connector 120 mounted on the PCSB 10 and electrically connected to the plurality of traces 140.

Figure 2:
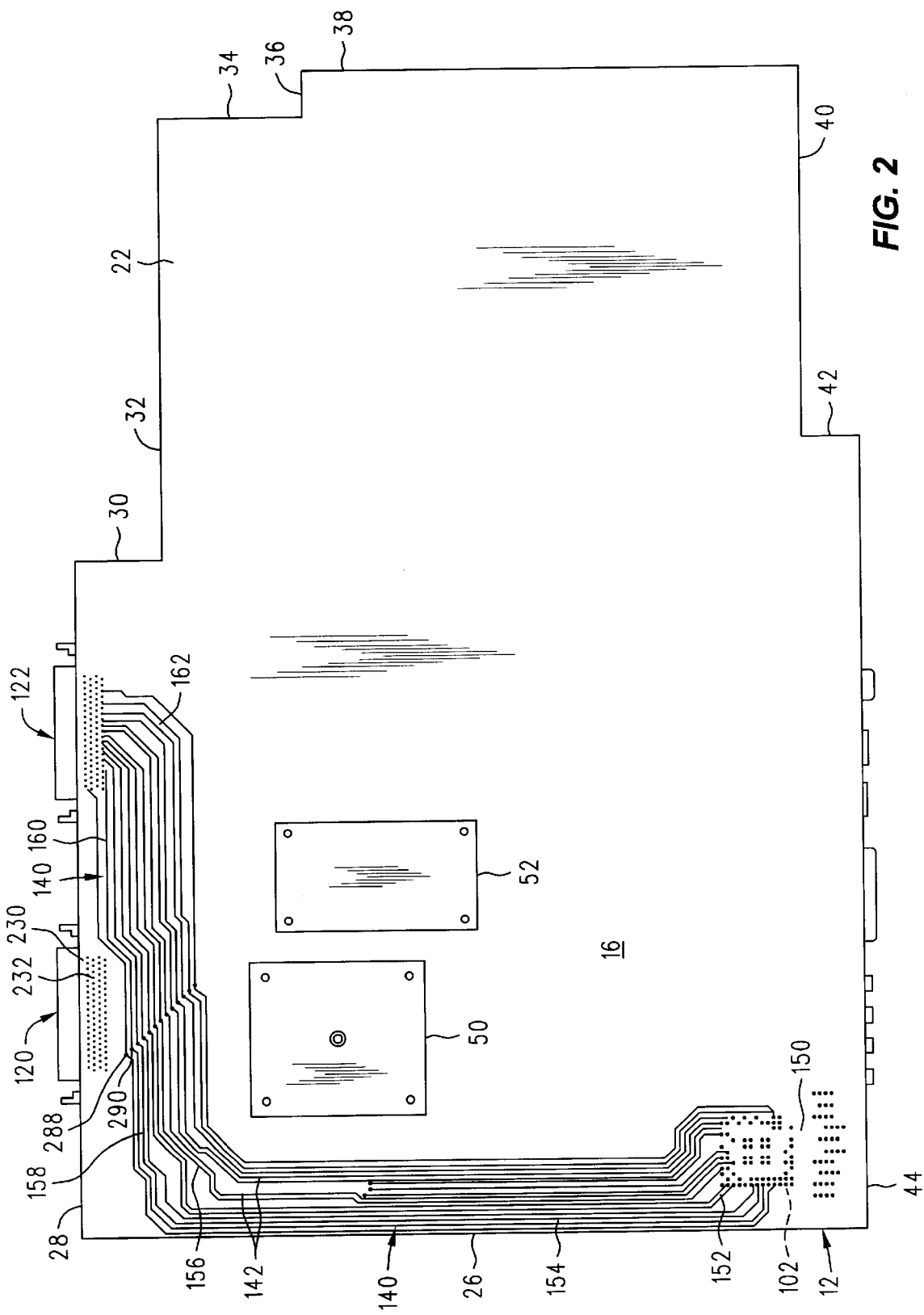
FIG. 2 is a bottom plan view of the PCSB of FIG. 1.

FIGS. 1 and 2 illustrate one embodiment of a printed circuit system board assembly 10. A "printed circuit system board assembly" (PCSB), as that phrase is used herein, means a printed circuit board for a computer, such as a personal computer, work station or server, which is the primary circuit board for that computer. A printed circuit system board will thus comprise at least the main central processing unit for the computer and is distinguishable from auxiliary circuit boards often referred to as "back planes" which do not contain the computer central processing unit.

The PCSB 10 comprises a board 12, FIGS. 1 and 2, made up of multiple component layers which may each have electrical circuitry provided therein. The circuitry may be interconnected between layers by conductors, known as vias, which extend perpendicularly through the board. A typical PCSB in a personal computer may have 4 to 6 component layers. A typical PCSB in a computer work station or server may have 8 to 10 or more layers. Printed circuit boards construction, as generally described immediately above, is well known in the art. The Board 12 shown in the drawings comprises a first surface layer or "top" layer 14, a second surface layer or "bottom" layer 16 and a plurality of intermediate layers positioned between layers 14 and 16. (It is to be understood that the terms "top" and "bottom" are used herein because they are familiar reference terms which facilitate description of the preferred embodiments of the invention. However these terms are entirely arbitrary and are not to be construed in a manner which in any way limits the scope of the invention.) One of the intermediate layers may comprise a ground plane (not shown) constructed from a thin layer of copper or the like. The board has a peripheral portion 22 and a central portion 24. The peripheral portion 22 terminates at a plurality of interconnected, linear, peripheral edge portions 26, 28, 30, 32, 34, 36, 38, 40, 42, 44.

The top layer 14 has a plurality of computer components mounted thereon including at least a central processing unit assembly 50 which may include a central processing unit (CPU) and may also include associated cooling devices such as fans, heat sinks, and the like. The top layer 14 may also have mounted thereon other typical system board devices such as a memory and input/output (I/O) controller assembly 52, graphics integrated circuits (I/C's) 54, a PCI bus converter chip 56, expansion slots 58, memory slots 60, power supply cable connectors 62, a voltage regulator module 64, audio ports 66, a parallel port 68, a LAN port 72, a USB port 74, a serial port 76, and a graphics port 78. It is to be understood that the above list of components, other than the central processing unit, is merely one exemplary embodiment of a modern printed circuit system board. It is not to be construed to limit the invention to any specific PCSB board components or component arrangement except that the PCSB 10 must include the computer CPU and LVD SCSI bus as described further below.

The PCSB 10 comprises a small computer systems interface (LVD SCSI) standard controller I/C 102 which may be an ASIC. A plurality of LVD SCSI terminators 104, 106 and 108 are mounted adjacent to the controller 102. The LVD SCSI bus controller 102 and terminators 104, 106, 108, may be mounted at a peripheral portion of the PCSB 10 adjacent to terminal edge 26. The PCSB 10 is provided with at least one and preferably a plurality of LVD SCSI direct connector couplings 120, 122 which may be mounted on a peripheral portion of the board adjacent to edge 28. Although two direct connector couplings are shown, it is to be understood that more such couplings could be provided, depending upon the size of the PCSB 10, and the number of LVD SCSI devices which are to be connected. A plurality of LVD SCSI terminators 124, 126, 128 are positioned adjacent to the last LVD SCSI direct connector coupling 122. The LVD SCSI direct connector couplings may be of any type used to directly connect a LVD SCSI device such as a hard disk, 320, FIG. 10. or other LVD SCSI device such as DVD drive, CD-ROM drive, etc. One conventional LVD SCSI direct connector device, well known in the art and further described below, is an SCA-2 connector.

Figure 3:
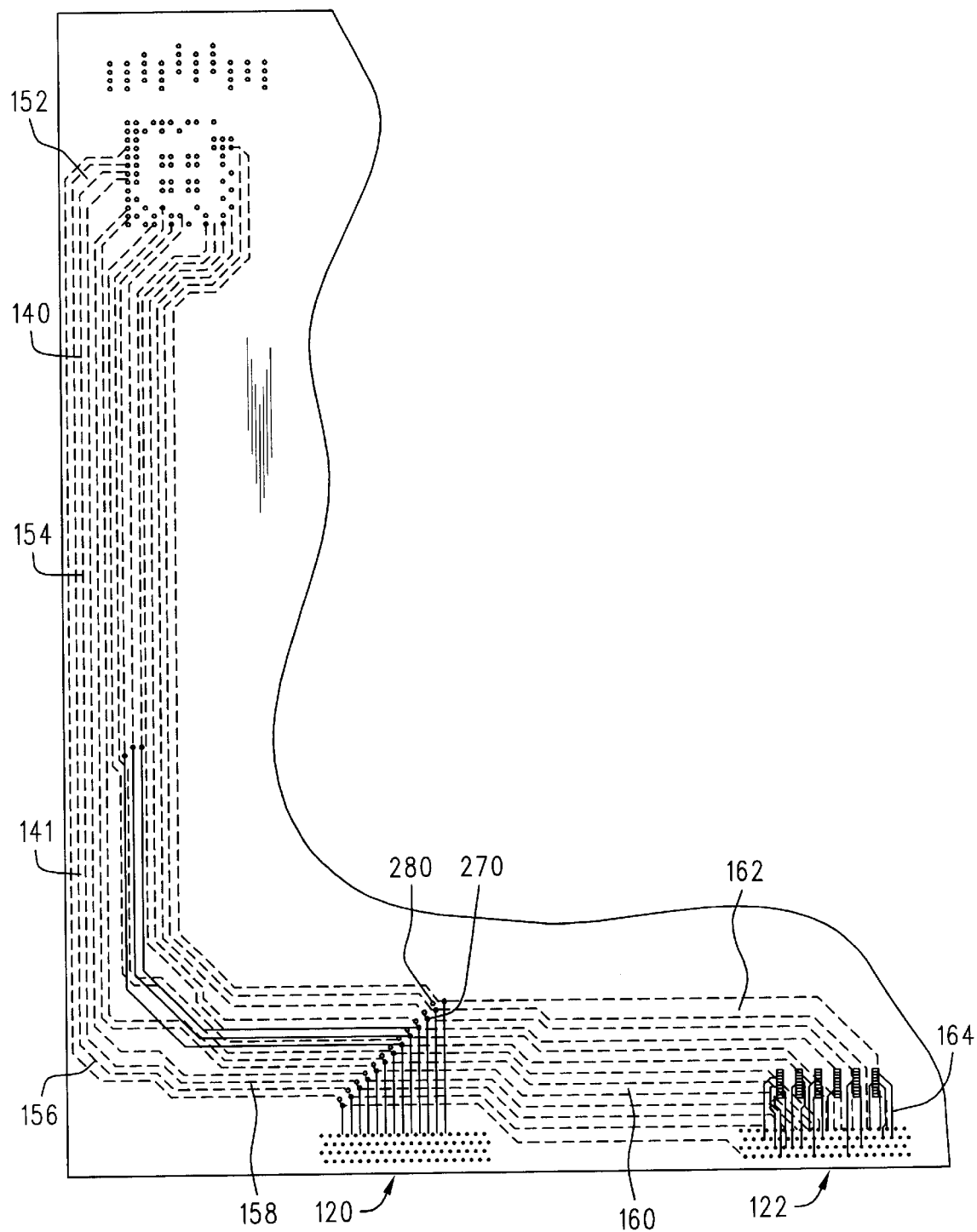
FIG. 3 is a top plan view of a portion of the PCSB of FIGS. 1 and 2, with LVD SCSI bus traces on a bottom portion thereof shown with dashed lines.
Figure 4:
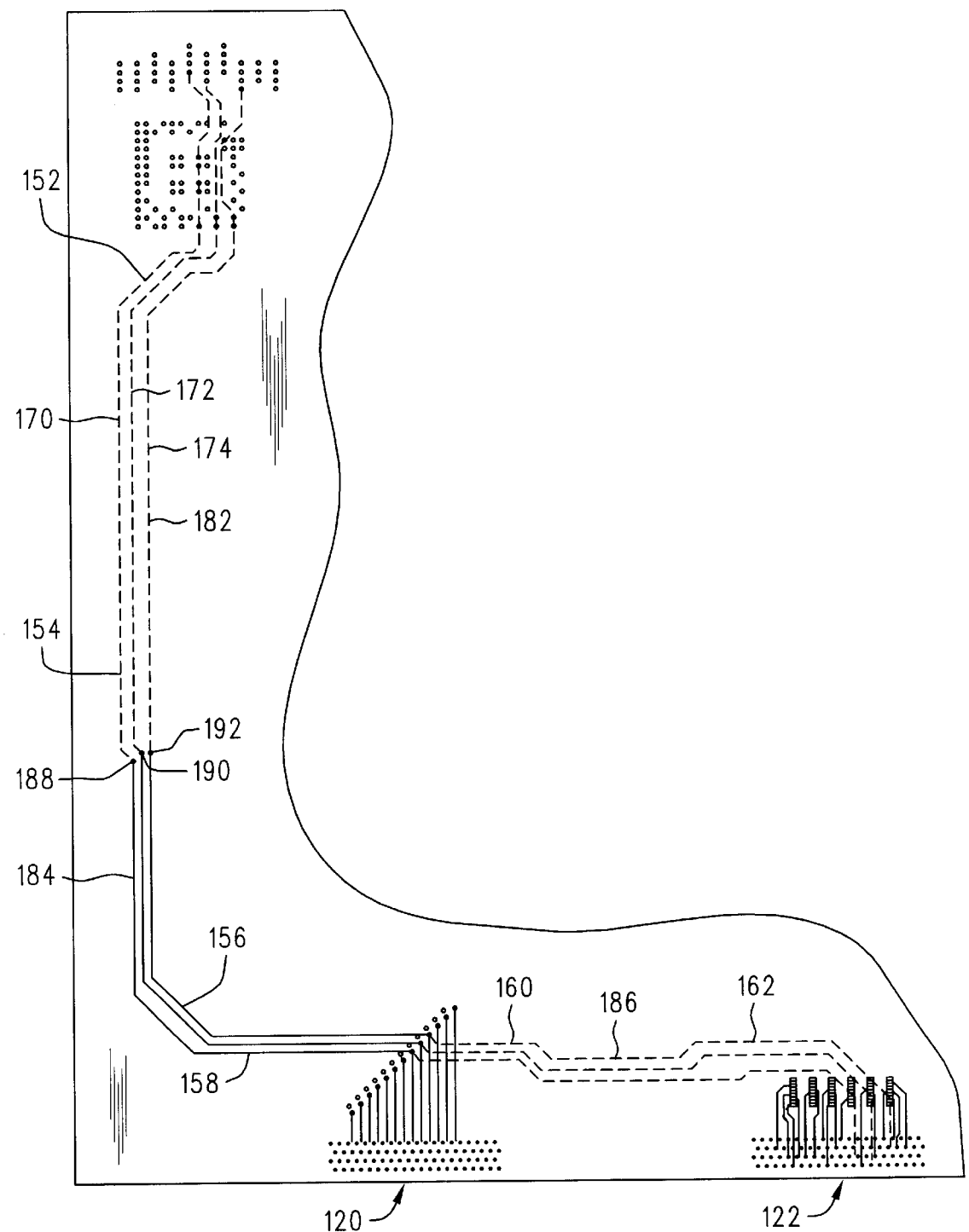
FIG. 4 is the same top plan view of the PCSB as FIG. 3, but with LVD SCSI bus signal traces other than the RESET, SELECT AND BUSY signal traces removed.

As best shown in FIGS. 2 and 3, a LVD SCSI signal bus 140 comprises a plurality of signal traces extending from the LVD SCSI bus controller 102 to the LVD SCSI direct connector couplings 120, 122. A pair of signal traces are associated with each signal in the signal bus. Such trace pairs are positioned adjacent one another in the bus. The LVD SCSI signal bus 140 includes a first plurality of signal traces 142 which are contained solely in one of the outer layers of the PCSB, which in the illustrated embodiment is bottom layer 16. (However, certain trace portions used to connect these signal traces to the LVD SCSI connectors and terminators are not in bottom layer 16.) The LVD SCSI bus 140 also comprises a second plurality of signal traces 144, FIG. 4, extending at least partially in a second external layer of the board, which in the illustrated embodiment is top layer 14. Each of the LVD SCSI signal pairs may have an upstream portion thereof extending along an upstream terminator path 150 from the LVD SCSI bus controller 102 to the upstream terminators 104, 106, 108 which may be a relatively short length portion e.g., 0.2 inches to 0.5 inches and which may be contained on an inner layer of the board (not shown). The LVD SCSI signal 140 follows a path 141 from controller 102 to the connectors 120, 122. "Path" as used herein refers to the route followed by the traces as considered in plan view, regardless of which component layer or layers of the board 12 in which the traces are positioned. In FIGS. 3 and 4, dashed lines indicate traces that are in the bottom layer 16 and solid lines indicate traces in the top layer 14.

The path of the LVD SCSI signal bus 140 from Controller 102 to the direct connectors 120, 122 comprises a first path portion 152 extending away from the controller 102, at least part of this path portion being in a transverse relationship with edge 26. First path portion 152 may have the length of about 1.0 to 1.5 inches. The path includes a second portion 154 extending generally parallel to edge 26 for a length of about 6 to 8 inches. A third portion 156 of the path extends transversely to edges 26 and 28 for a length which may be between approximately 0.2 and 1.2 inches. A fourth portion 158 of the path extends parallel to edge 28 from the third path portion to a plurality of vias 280, 290, etc., shown in detail in FIG. 8. The fourth path portion may extend about 1.5 to 2.5 inches. A fifth path portion 160, extends from the fourth path portion parallel to edge 28 about 4.0 to 4.5 inches, including a short e.g., 0.2 inch transverse region. A sixth path portion 162 extends from the fifth path portion transversely to edge 28 into connection with the connector pins of the second LVD SCSI connector coupling 122 and may have a length of about 0.0 to 1.0 inches. A downstream terminator path 164 extends from the second connector pins to downstream terminators 124, 126, 128 a distance of between approximately 0.2 to 0.5 inches. All path portions 152, 154, 156, 158, 160, 162 of the path 141 of the plurality of signal traces 140 preferably extend along the peripheral portion 22 of the circuit board for general board layout purposes but some or all portions of the path could be extended through a central portion 24 of the board as well.

The first plurality of traces 142 extend along path 141 entirely on one external layer (layer 16 in the illustrated embodiment) of the PCSB 10. The only trace components associated with the first plurality of traces 142 which are not positioned on layer 16 are terminator trace extensions in paths 150 and 164 which connect the first plurality of traces 142 to the upstream and downstream terminators and stub traces (described in greater detail below) which branch off the first plurality of traces 142 at right angles to connect traces 142 to the first direct connector coupling 120.

The second plurality of signal traces 144 may follow the same trace path 141 as the first plurality of signal traces 142. The difference, however, is that the second plurality of traces 144 extend along at least a portion of this path in the surface layer 14 opposite to the surface layer 16 in which the entire length of the first plurality of signal traces 142 is contained. This second set of signal traces 144 comprises fewer signal pairs than the first plurality of signal traces 142 and preferably includes at least the RESET signal pair 170, the SELECT signal pair 172, and the BUSY signal pair 174. The RESET, SELECT and BUSY signal pair traces are preferably positioned next adjacent one another the entire length of the signal bus. i.e. no other bus signal traces are positioned between any two of the RESET SELECT and BUSY signal pairs.

In the illustrated embodiment of FIGS. 1–4, although the same path as the first plurality of signal traces is followed, the second plurality of signal traces 144 has a first length 182 located in the bottom layer 16, a second length 184 (which may be about 5.0 in. long) located in the top layer 14, and a third length 186 located in the bottom layer 16. The transition between the first length 182 and the second length 184 is provided by vias 188, 190, 192, as best shown in FIG. 4. The vias connect the portion of the RESET, SELECT and BUSY signal pairs in the bottom layer length 182 with the corresponding RESET, SELECT and BUSY signal pairs in the top layer length 184. In FIG. 4 the lengths of signal pairs 170, 172, 174 are shown with the signals of the first plurality of signal traces 142 removed for clarity. As previously mentioned, the dashed lines indicate signal traces located in the bottom layer 16 of the board and solid lines indicate the portions of these signal traces located in the top layer 14 of the board.

Figure 11:
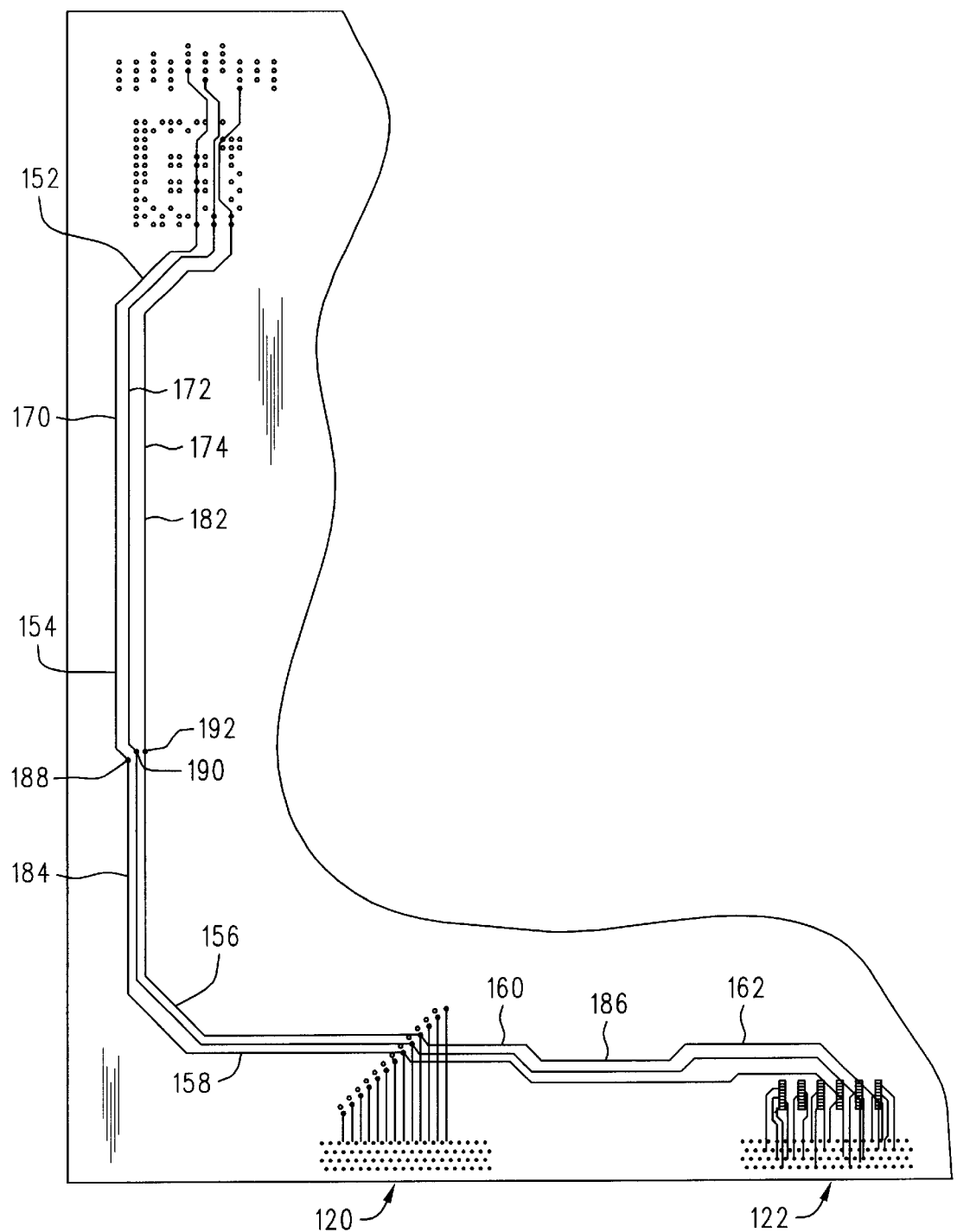
FIG. 11 is a top plan view of a portion of an alternate embodiment of a PCSB on which the RESET, SELECT AND BUSY signal traces are positioned for their entire length between LVD SCSI controller and direct connector coupling on one exterior layer of the PCSB and other LVD SCSI bus signal traces are positioned on the other exterior layer.

In another preferred embodiment illustrated in FIG. 11, the first plurality of signal traces 142 are located in surface layer 16 along their entire length from controller 102 to the vias associated with connector 120 and the second plurality of signal traces 144 are located in surface layer 14 along their entire length from controller 102 to the vias associated with connector 120.

Figure 5:
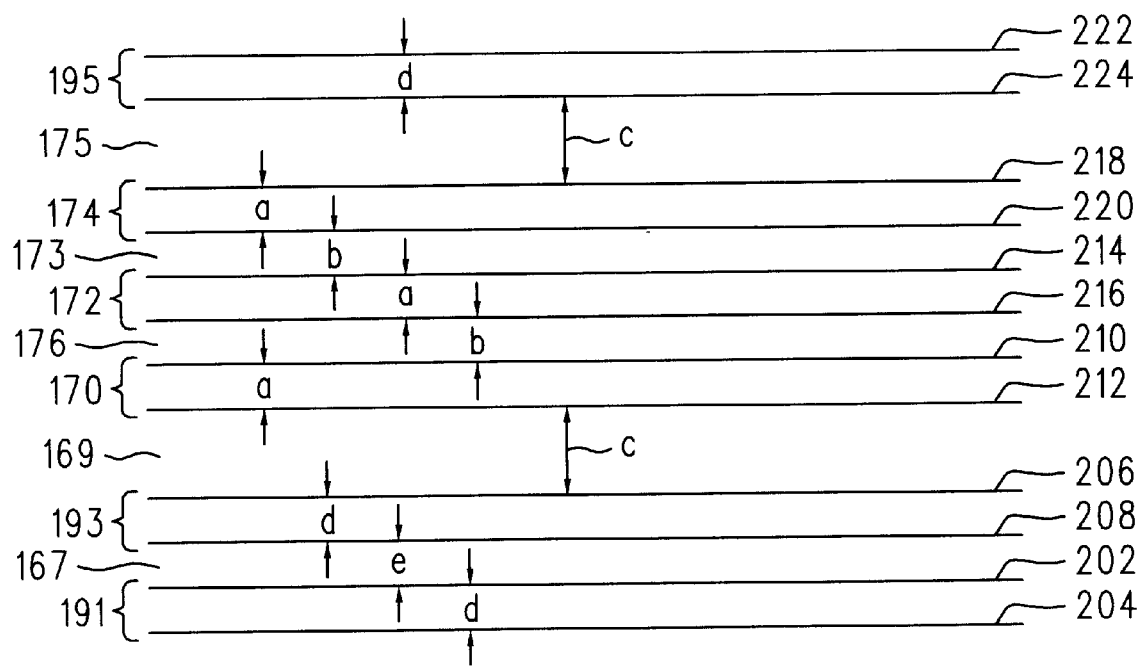
FIG. 5 is a magnified view of a portion of some of the traces on the PCSB of FIGS. 1 and 2.
Figure 7:
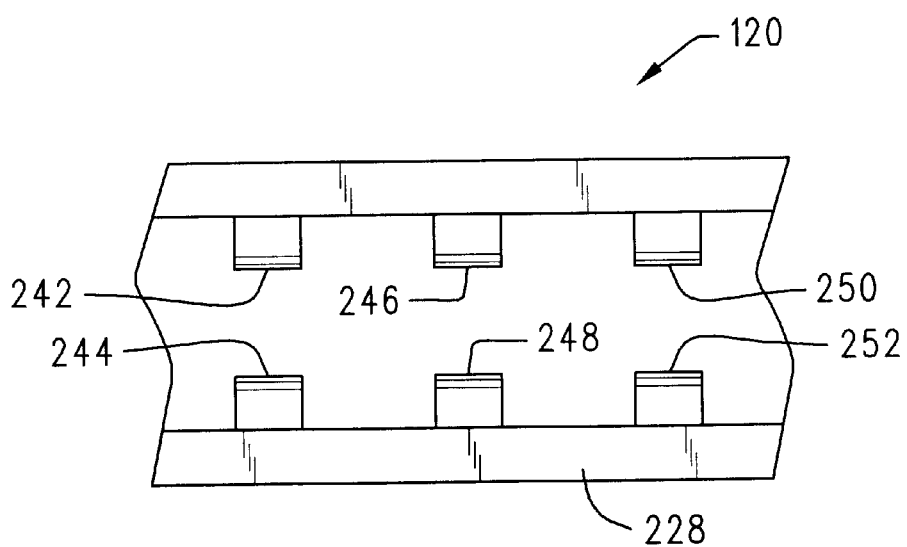
FIG. 7 is a blown-up, side elevation view of a portion of the LVD SCSI direct connector coupling of FIG. 6.

FIG. 5 shows the arrangement and minimum spacing values of signal trace pairs in signal path regions where the traces are all in the same exterior surface layer of the board 12 such as path portion 152 and part of path portion 154. Trace pairs 191, 193, 170, 172, 174 and 195 are shown. These trace pairs are separated by trace pair gaps 167, 169, 171, 173, and 175, respectively. These trace pairs comprises individual traces 202, 204; 206, 208; 210, 212; 214, 216; 218, 220; and 222, 224, respectively. Traces 210 and 212 of RESET signal pair 170 have a minimum spacing "a" between them of about 0.006 in. The SELECT signal pair 172 and the BUSY signal pair 174 also have a minimum internal spacing "a" of about 0.006 in. These three trace pairs 170, 172, 174 are always positioned adjacent to one another in the signal bus as illustrated if FIG. 5 and have a minimum spacing "b" from one another of about 0.008 in. The outside trace pairs 170, 174 of this group of trace pairs are each spaced from the next adjacent trace pair outside the group a minimum distance "c" of about 0.015 in., i.e. gaps 169 and 175 each have a minimum width of about 0.015 in. The traces other than 170, 172 and 174, i.e. 191, 193, 195, etc. each have a preferred internal spacing "d" of about 0.006 in. The minimum spacing "e" between these other trace pairs, e.g. pairs 191 and 193, is about 0.006 in. It is particularly important that the RESET, SELECT, and BUSY group of signal pairs 170, 172, 174 are maintained at no less than about 0.015 in. from any signal pair adjacent to this group 170, 172, 174. In areas where it is not possible to maintain all signal pairs at this separation distance without moving some of the signal pairs to another side of the board, it is the RESET, SELECT, and BUSY signals which, according to the present invention, should be moved to the opposite side of the board. Applicant has discovered that by moving these three signals to an opposite side of the board in crowded regions, the performance of the LVD SCSI bus is substantially improved because these three signals are the most susceptible to the problems with cross talk and other forms of signal noise. The performance of the signal bus may be even further improved by running the SELECT, RESET, and BUSY signal pairs on an opposite side of the PCSB 10 from the majority of signal pairs of the bus for the entire length of the bus from the controller 102 to the first direct connector coupling. Such an embodiment is shown in FIG. 11, described above, in which signal pairs 170, 172, 174 are all positioned in the top layer 14 of the board and the other signal traces 142 remain where shown in FIGS. 2 and 3. The SELECT, RESET and BUSY signals are particularly susceptible to cross talk from other SCSI signals and other noise due to the fact that unlike other LVD SCSI signals, they are never actively driven low. By providing adequate spacing for these signals as indicated above, and by moving these signals to an opposite surface layer in "tight" regions of the signal path, the risk of excessive electrical interference which degrades signal integrity is substantially reduced. The chance of creating a nonfunctioning LVD SCSI bus is thus significantly reduced by this routing technique.

Figure 6:
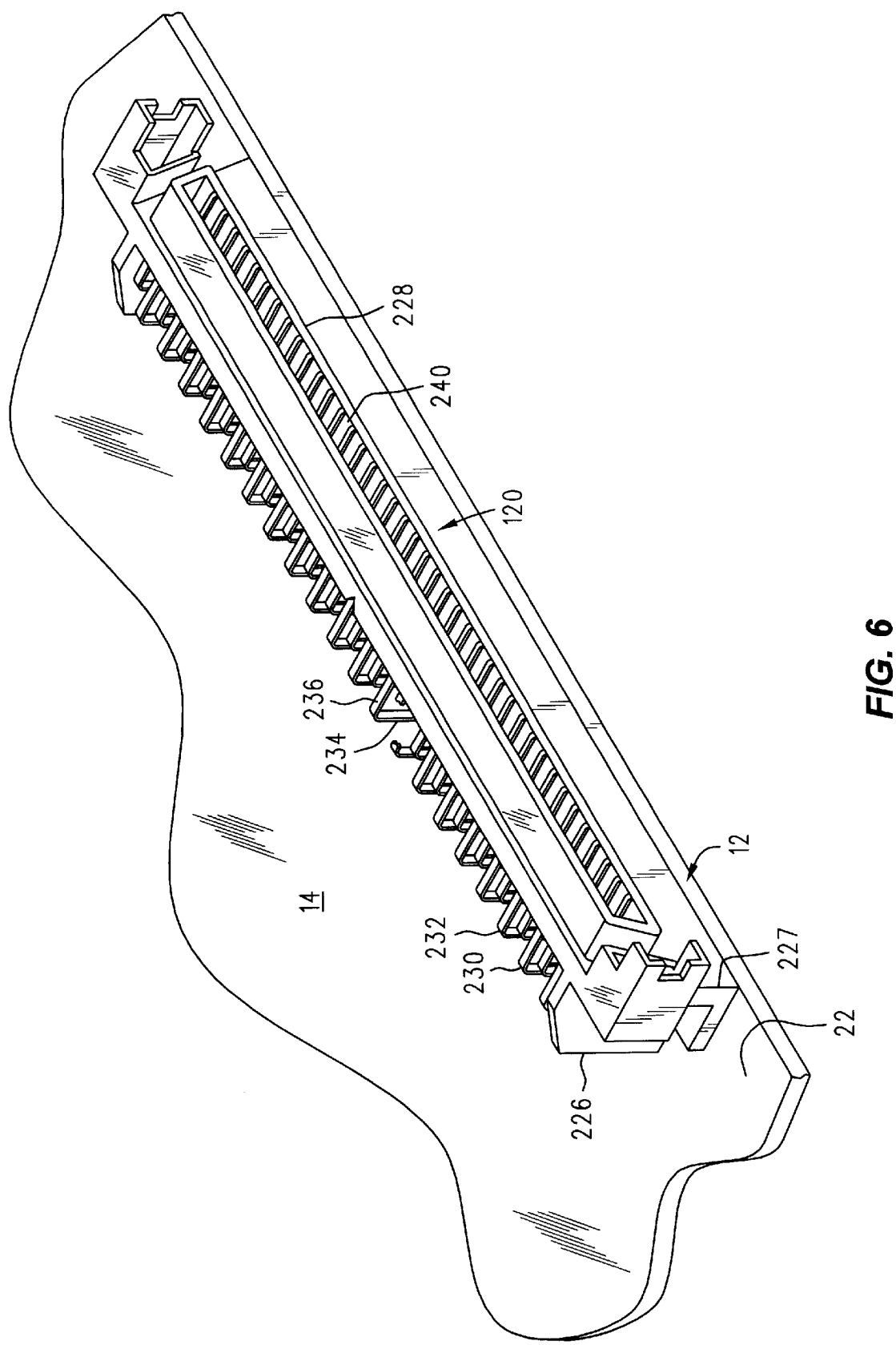
FIG. 6 is a perspective view of a portion of the PCSB of FIGS. 1 and 2 showing one of the LVD SCSI direct connector couplings thereof.
Figure 8:
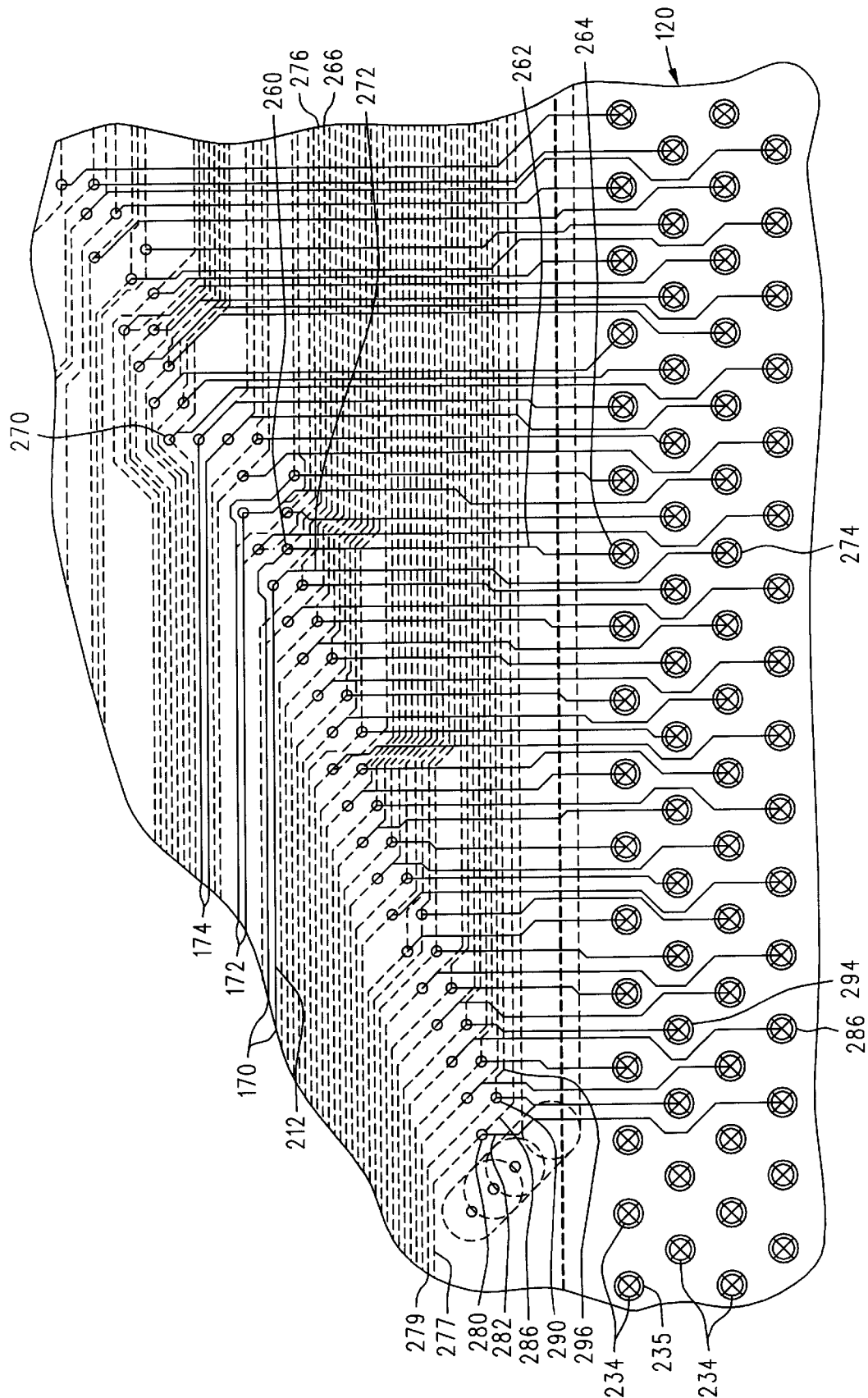
FIG. 8 is a detail, top plan view of a portion of the PCSB of FIGS. 1 and 2 in the region of one LVD SCSI direct connector couplings, but with the coupling removed, and showing connector pin portions and associated throughholes and signal traces and associated vias.

As previously mentioned, the LVD SCSI direct connector couplings 120, 122 mounted on the PCSB 10 may be conventional SCA-2 connectors. Such connectors are often used on back plane printed circuit boards for directly operably connecting LVD SCSI devices to the back plane but to applicants' knowledge have never been used for the purpose of directly (without cables) connecting a LVD SCSI device to a PCSB. The manner of physically attaching an SCA-2 connector to a PCSB is essentially identical to the manner of attaching an SCA-2 to a back plane which is well known in the art. FIG. 6 is a perspective view of an SCA-2 connector embodiment of socket 120. The connector comprises a plastic casing 226 having a lower portion 227 with a flat face surface mounted in a abutting relationship with the top surface layer 14 of the PCSB. Plastic casing 226 has a socket portion 228 projecting outwardly past the peripheral edge 28 of the PCSB 10. The connector comprises a plurality of conductor pins 230, 232. Each pin has a first portion 234 extending perpendicular to the PCSB 10 and a second portion 236 extending parallel to the PCSB. The first portion 234 of each pin extends through an associated through holes, e.g. 235, FIG. 8, provided in the board 12 which helps to physically secure the associated connector 120, 122 to the PCSB 10 as well as providing a conductor path which may be attached to a signal traces at either the top layer 14 or bottom layer 16 of the PCSB 10. The conductor pins of each of the LVD SCSI direct connector coupling 120 are arranged in opposed pairs which are connected to respective ones of the traces of each signal pair of the LVD SCSI bus signal traces 140. In the SCA-2 connector, each pair of pins thus connected has a terminal end pair e.g., 242, 244; 246, 248; 250, 252, FIG. 7, which all terminate at a common plane extending perpendicular to the plane of the PCSB 10. The terminal ends of each pin pair are arranged opposite one another and are adapted to contact corresponding pin pairs in a mating direct connector coupling 322 of a LVD SCSI device, such as a hard drive 320, FIG. 10. The operation of SCA-2 connectors is well known in the art.

Connection of the LVD SCSI bus signal traces 140 to the first LVD SCSI direct connector coupling 120 will now be described with reference to FIG. 8. As previously mentioned, each LVD SCSI direct connector 120, 122 has a plurality of conductor pins 230, 234 which have a pin portion 236 extending perpendicular to the PCSB 10 which passes through a corresponding through hole 235 in the PCSB. In the exemplary embodiment shown in FIG. 8, the through holes are provided in four rows extending parallel to edge 28 of the PCSB. Each trace of the LVD SCSI bus signal traces 140 is connected to a different one of the connector pins by a signal stub, i.e., a small length of trace material which branches off from the main signal trace in a direction generally perpendicular to PCSB edge 28. The stub is connected at one end to an associated connector pin. This connection is made in the top layer 14 of the PCSB 10. The stub is connected at its opposite end to a via which is in turn connected to a single signal trace. That signal trace may be positioned at the bottom component layer 16 of the PCSB 10 in the case of signal traces from the first plurality of signal traces 142 or it may be positioned in the top layer 14 of the PCSB in the case of signal traces in the second plurality of signal traces 144. The electrical connection of certain representative signal traces to connector 120 will now be described.

Trace pair 170, the RESET signal pair, comprises traces 210 and 212 positioned in the top layer 14 of the PCSB 10 in the region of the board 12 near connector 120. Signal trace 210 is electrically connected in the top layer 14 of the board to via 260. Via 260 is also connected in the top layer of the board to signal stub 262. Signal stub 262 extends, in the top layer of the board from via 260 to connector pin 264. The manner by which electrical connections are made between the vias, stubs, and pins may be by conventional soldering or other circuit fabrication techniques well known in the art. Trace 210 extends on from via 260 in trace extension portion 266 provided in the bottom layer 16 of the board. Similarly, trace 212 is connected to via 270 which is in turn connected to stub 272 and thence to pin 274 in the top layer of the board. The extension of trace 212 is trace extension portion 276 which extends out from via 270 in the bottom layer 16 of the board.

Trace pair 277, 279, in the region of connector 120, are positioned in the bottom layer 16 of the board. Trace 277 is connected to via 280 which is in turn connected to stub 282 provided in the top layer of the board. Stub 282 extends in the top layer of the board to pin 284. Trace 277 has an extension 286 extending from via 280 in the bottom layer 16 of the board. Trace 279 is similarly electrically connected to pin 294 through via 290 and stub 292 and comprises a bottom layer extension 296. In order to avoid intersecting contact with the stubs extending to the first connector 120, all of the extensions from the first set of vias 270, 280, 290, etc. associated with the first connector 120, are located only in the bottom layer 16 of the PCSB 10.

Figure 9:
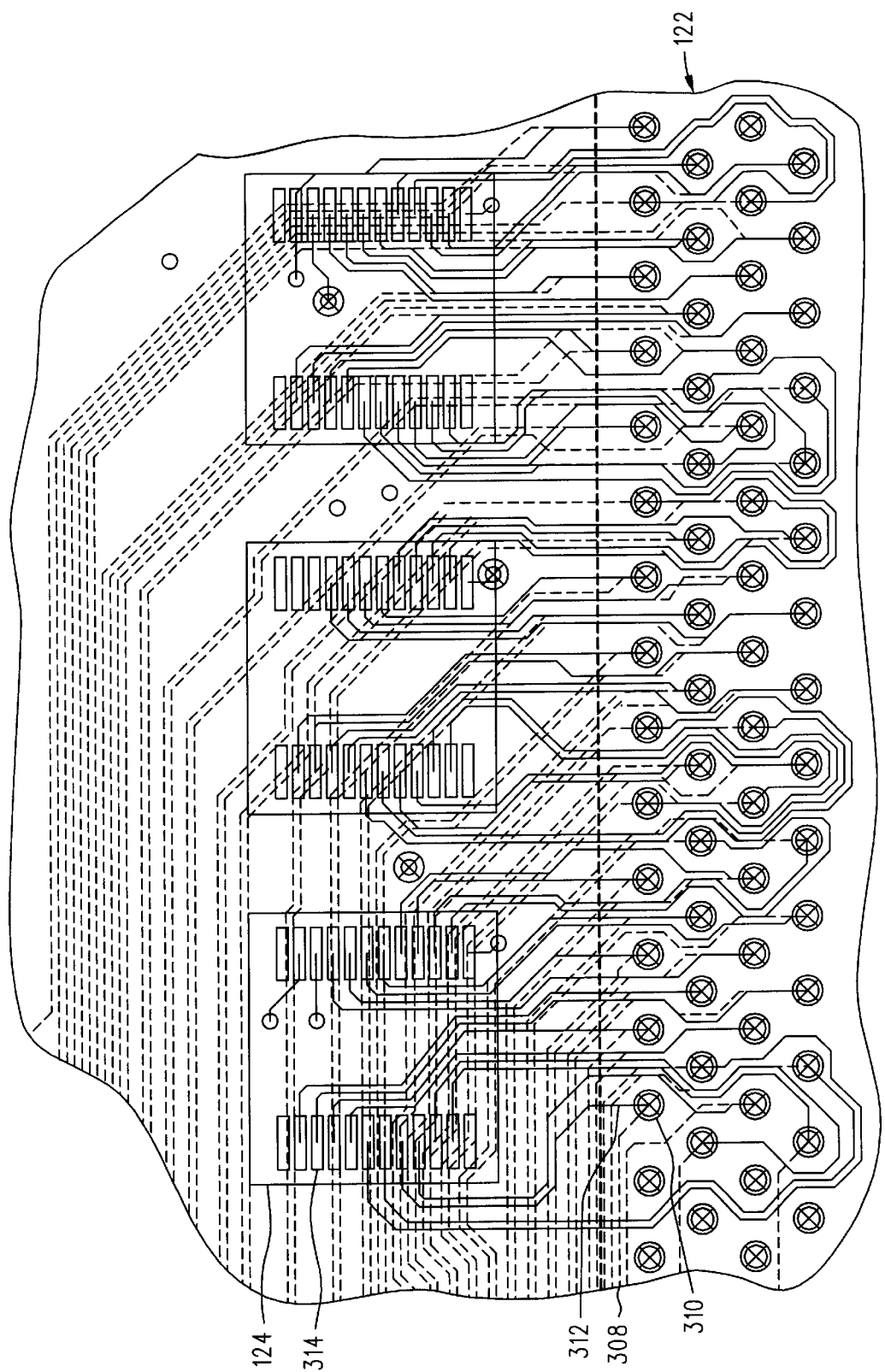
FIG. 9 is a detail, top plan view of a portion of the PCSB of FIGS. 1 and 2 in the region of a second LVD SCSI direct connector couplings showing details similar to those shown in FIG. 8.
Figure 10:
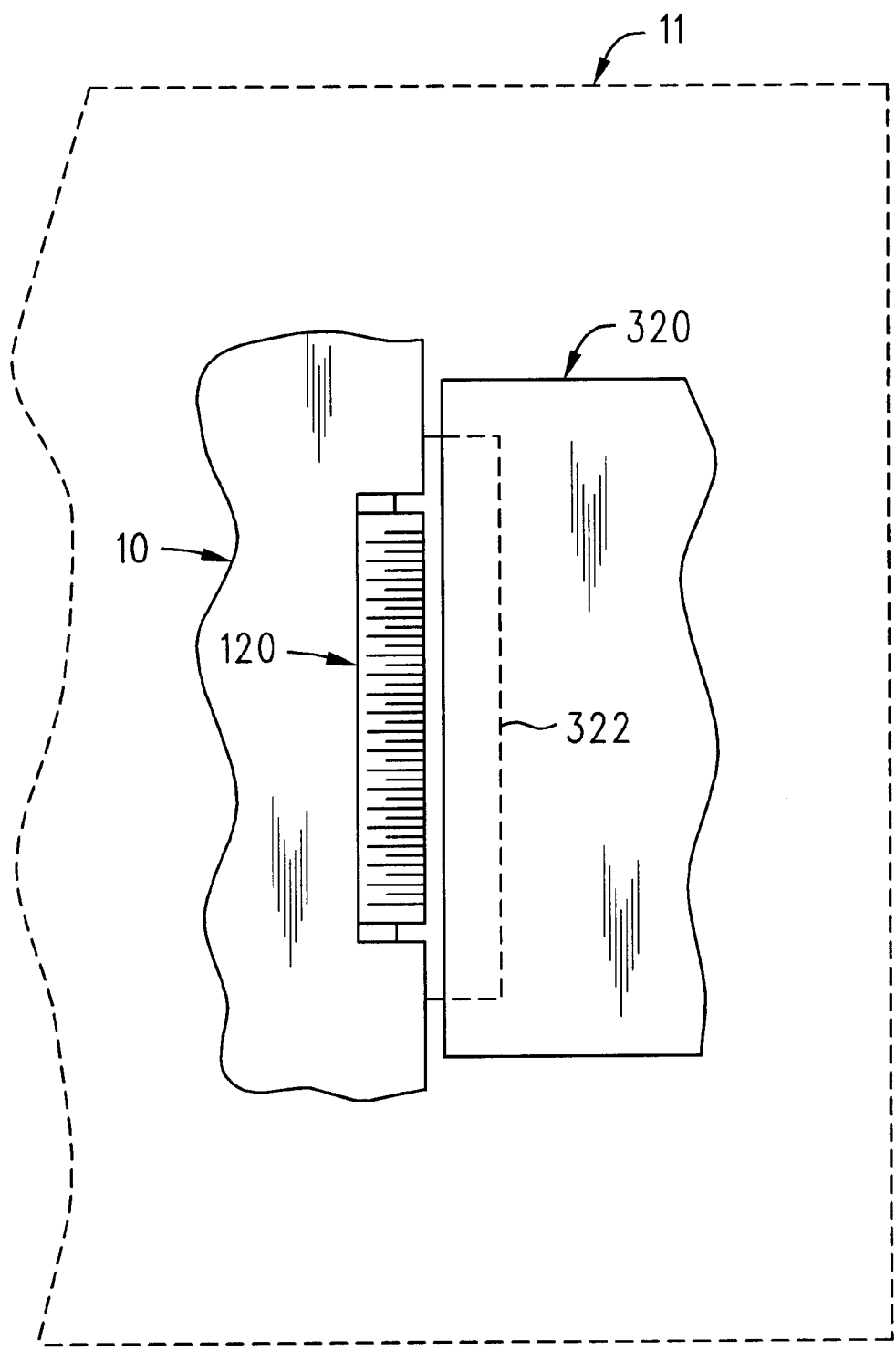
FIG. 10 is a schematic drawing of a PCSB mounted inside a computer and having a hard drive connected to a direct connector coupling of the PCSB.

The extension of each of the traces from the first set of vias to the second connector 122 are all provided in the bottom layer 16 of the board and are all connected directly to an associated connector 122 pin at a position in the bottom layer. FIG. 9 shows a typical bottom layer trace 308 connected to connector pin 310 in bottom layer 16. An associated terminator stub 312 extends from pin 310 to an associated terminator 124 in the top layer 14 of the PCSB 10. All of the traces portions attached to the second connector 122 may be subsequently attached to a terminator 124, etc., in this matter. If additional LVD SCSI direct connector couplings such as 120, 122 had been provided on the board, the strategy of "popping" the signal traces from one surface layer to the opposite surface layer prior to stubbing the trace to an associate connector pin, which was used with traces 142 connected to connector 120, would be used for all but the last of the multiple connectors mounted on the PCSB 10.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A Printed Circuit System Board (PCSB) assembly comprising:
   a PCSB;
   a plurality Low Voltage Differential (LVD) Small Computer Systems Interface (SCSI) bus signal traces formed in said PCSB; and
   a LVD SCSI direct connector mounted on said PCSB and electrically connected to said plurality of traces
   wherein said LVD SCSI bus traces comprise a first plurality of signal traces extending from a LVD SCSI controller to said LVD SCSI direct connector entirely in one exterior board layer of the PCSB and a second plurality of traces extending from said LVD SCSI controller to said LVD SCSI direct connector at least partially in a second exterior board layer of said PCSB opposite said first layer and wherein said second plurality of traces comprises at least one of a RESET signal trace, a SELECT signal trace and a BUSY signal trace.

2. The PCSB assembly of claim 1 wherein said PCSB comprises a board peripheral portion and wherein said LVD SCSI direct connector is mounted on said board peripheral portion.

3. The PCSB assembly of claim 1 wherein said PCSB comprises a board peripheral portion and wherein said plurality of traces are positioned on said peripheral portion.

4. The system board assembly of claim 2 wherein said plurality of traces are positioned on said peripheral portion.

5. The PCSB of claim 1 further comprising at least one LVD SCSI bus upstream terminator connected to upstream end portions of said LVD SCSI bus signal traces and at least one LVD SCSI bus downstream terminator connected to downstream end portions of said LVD SCSI bus signal traces.

6. The PCSB assembly of claim 5 comprising:
 a second LVD SCSI direct connector mounted on said PCSB and electrically connected to said plurality of traces.

7. The PCSB of claim 4 further comprising at least one LVD SCSI bus upstream terminator connected to upstream end portions of said LVD SCSI bus signal traces and at least one LVD SCSI bus downstream terminator connected to downstream end portions of said LVD SCSI bus signal traces.

8. The PCSB of claim 4 wherein said second plurality of signal traces comprise at least two of a RESET signal trace, a SELECT signal trace and a BUSY signal trace.

9. The PCSB of claim 4 wherein said second plurality of signal traces comprise a RESET signal trace, a SELECT signal trace and a BUSY signal trace.

10. The PCSB of claim 4 wherein said LVD SCSI bus traces comprise a first plurality of signal traces extending from a LVD SCSI controller to said LVD SCSI direct connector entirely in one exterior board layer of said PCSB and a second plurality of traces extending from said LVD SCSI controller to said LVD SCSI direct connector entirely in a second exterior board layer of said PCSB opposite said first layer and wherein said second plurality of traces comprises at least one of a RESET signal trace, a SELECT signal trace and a BUSY signal trace.

11. The PCSB of claim 10 wherein said second plurality of traces comprise a RESET signal trace, a SELECT signal trace and a BUSY signal trace.

12. The PCSB of claim 1 comprising a plurality of a LVD SCSI direct connectors mounted on said PCSB and electrically connected to said plurality of traces wherein at least one of said plurality of traces is located in a first surface layer of said PCSB and is electrically connected to a first end of a trace stub positioned in a second surface layer of said PCSB by a via and wherein said trace stub has a second end connected to a pin portion of said LVD SCSI direct connector.

13. A method of making a Printed Circuit System Board (PCSB) assembly comprising:
 forming a plurality Low Voltage Differential (LVD) Small Computer Systems Interface (SCSI) bus signal traces on a PCSB;

mounting a LVD SCSI direct connector on said PCSB; and electrically connecting said plurality of traces to said LVD SCSI direct connector wherein said LVD SCSI bus traces comprise a first plurality of signal traces extending from a LVD SCS controller to said LVD SCSI direct connector entirely in one exterior board layer of the PCSB and a second plurality of traces extending from said LVD SCSI controller to said LVD SCSI direct connector at least partially in a second exterior board layer of said PCSB opposite said first layer and wherein said second plurality of traces comprise at least one of a RESET signal trace, a SELECT signal trace and a BUSY signal trace.

14. The method of claim further comprising:

mounting a second LVD SCSI direct connector on said PCSB;

electrically connecting said plurality of traces to said second LVD SCSI direct connector; and connecting upstream ends of said plurality of LVD SCSI bus signal traces to at least one upstream terminator mounted on said PCSB and connecting downstream ends of said plurality of LVD SCSI bus signal traces to at least one downstream terminator mounted on said PCSB.

15. A computer comprising:

a printed circuit board;

a computer central processing unit operably mounted on said printed circuit board;

a Low Voltage Differential (LVD) Small Computer Systems Interface (SCSI) bus controller mounted on said printed circuit board;

a LVD SCSI direct connector mounted on said printed circuit board;

a plurality of LVD SCSI signal traces electrically connected to said LVD SCSI bus controller and to said LVD SCSI direct connector; and a LVD SCSI device directly operably mounted in said LVD SCSI direct connector wherein said LVD SCSI signal traces comprise a first plurality of signal traces extending from said LVD SCSI controller to said LVD SCSI direct connector entirely in one exterior board layer of he PCSB and a second plurality of traces extending from said LVD SCSI controller to said LVD SCSI direct connector at least partially in a second exterior board layer of said PCSB opposite said first layer and wherein said second plurality of traces comprises at least one of a RESET signal trace, a SELECT signal trace and a BUSY signal trace.

16. The computer of claim 15 wherein said LVD SCSI signal traces are terminated exclusively by LVD SCSI terminators mounted on said printed circuit board.

17. The computer of claim 15 further comprising:

a second LVD SCSI direct connector mounted on said printed circuit board and electrically connected to said plurality of signal traces;

a second LVD SCSI device directly operably mounted in said second LVD SCSI direct connector.

* * * * *